US009362816B2

(12) United States Patent
Chui et al.

(10) Patent No.: US 9,362,816 B2
(45) Date of Patent: Jun. 7, 2016

(54) START-UP CIRCUIT

(71) Applicant: Marvell World Trade Ltd., St. Michael (BB)

(72) Inventors: Siew Yong Chui, Singapore (SG); Jun Li, Singapore (SG)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/340,725

(22) Filed: Jul. 25, 2014

(65) Prior Publication Data

US 2014/0334200 A1 Nov. 13, 2014

Related U.S. Application Data

(63) Continuation of application No. 13/557,265, filed on Jul. 25, 2012, now Pat. No. 8,791,738.

(60) Provisional application No. 61/525,631, filed on Aug. 19, 2011.

(51) Int. Cl.
*H03K 3/02* (2006.01)
*H02M 1/36* (2007.01)
*H02H 7/22* (2006.01)
*H03K 17/082* (2006.01)
*H03K 17/687* (2006.01)

(52) U.S. Cl.
CPC ............... *H02M 1/36* (2013.01); *H02H 7/222* (2013.01); *H03K 17/0822* (2013.01); *H03K 2017/6875* (2013.01)

(58) Field of Classification Search
CPC ........................................................ H02M 1/36
USPC ...................................................... 327/198
See application file for complete search history.

(56) References Cited

U.S. PATENT DOCUMENTS

| 4,135,102 | A | | 1/1979 | Green et al. |
| 4,409,501 | A | * | 10/1983 | Eickerman et al. ........... 327/143 |
| 7,265,595 | B1 | * | 9/2007 | Kutz et al. ..................... 327/143 |
| 2002/0191359 | A1 | | 12/2002 | Chen |
| 2006/0170461 | A1 | * | 8/2006 | Bhattacharya et al. ......... 327/65 |
| 2008/0061634 | A1 | | 3/2008 | Iwata et al. |
| 2008/0291711 | A1 | | 11/2008 | Williams |

FOREIGN PATENT DOCUMENTS

| CN | 101755380 A | 6/2010 |
| EP | 0 423 885 B1 | 4/1994 |
| EP | 0621148 A2 | 10/1994 |
| WO | WO 2008/133859 A3 | 12/2008 |

OTHER PUBLICATIONS

International Preliminary Report on Patentability and Written Opinion of the International Searching Authority issued Mar. 6, 2014, in PCT/IB2012/001813, filed Jul. 25, 2012.

(Continued)

*Primary Examiner* — Daniel Puentes

(57) ABSTRACT

Aspects of the disclosure provide a circuit. The circuit includes a depletion mode transistor coupled to a power supply and a current path coupled with the depletion mode transistor in series to provide a current to charge a capacitor. The current path has a first resistance during a first stage, such as when the circuit initially receives power, and has a second resistance during a second stage when the capacitor is charged to have a predetermined voltage level.

23 Claims, 5 Drawing Sheets

(56) References Cited

OTHER PUBLICATIONS

U.S. Appl. No. 13/557,765, filed Jul. 25, 2012, by Ravishanker Krishnamoorthy et al., entitled "Method and Apparatus for Triac Applications".

U.S. Appl. No. 13/557,268, filed Jul. 25, 2012, by Siew Yong Chui entitled "Protection Circuit in the Triac Applications."

Office Action issued Nov. 12, 2015 in Chinese Patent Application No. 201280040352.9 (submitting partial English translation only).

Combined Chinese Office Action and Search Report issued Nov. 12, 2015 in Patent Application No. 201280040352.9 (with English translation of categories of cited documents).

\* cited by examiner

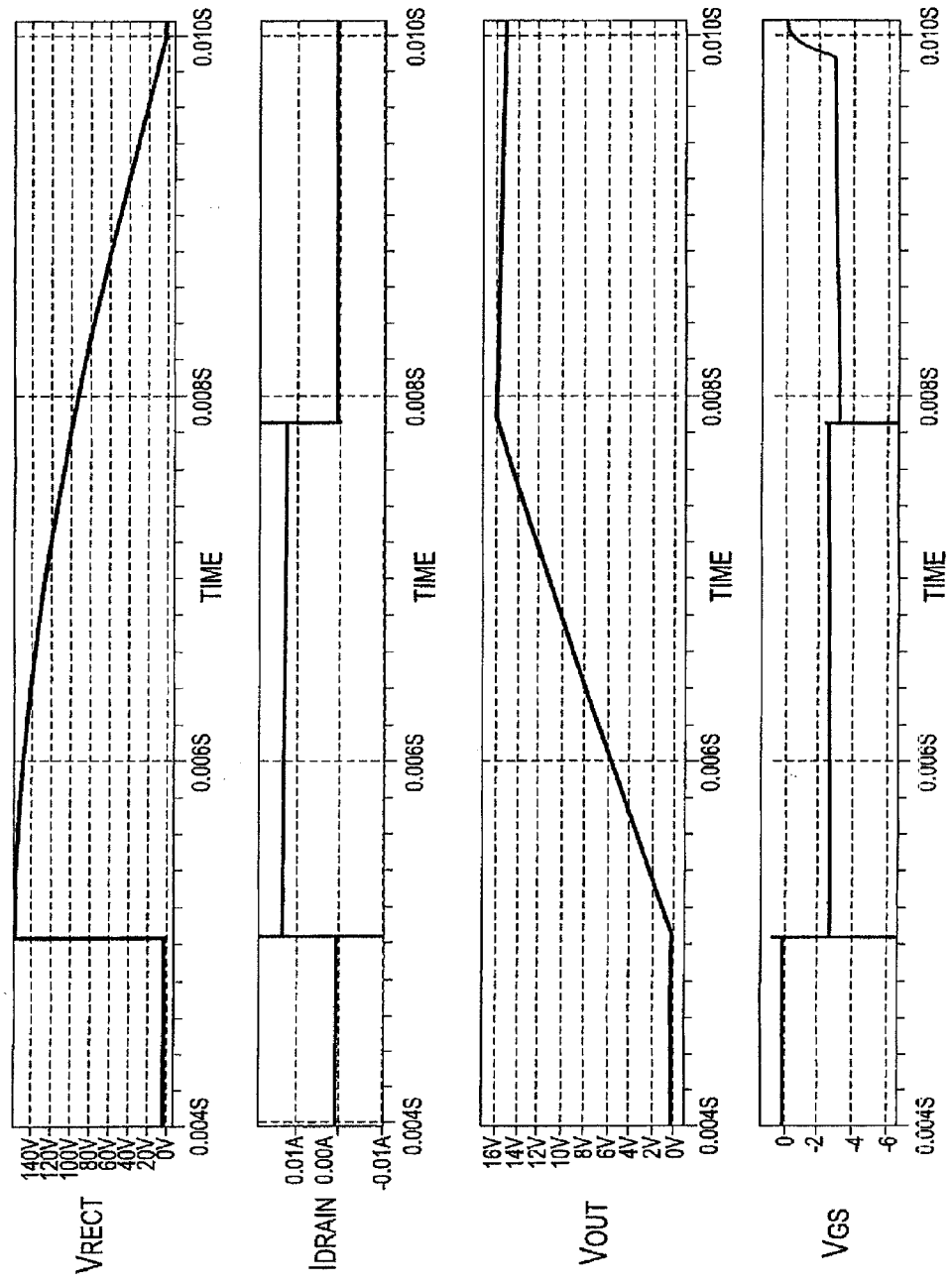

START-UP CIRCUIT

INCORPORATION BY REFERENCE

This application is a continuation of U.S. Ser. No. 13/557,265 filed Jul. 25, 2012, which claims the benefit of priority of U.S. Provisional Application No. 61/525,631, filed Aug. 19, 2011, the entire contents of both of which are incorporated herein by reference.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Some electrical and electronic devices, such as AC to DC power converters, and the like, need a start-up circuit to power up first and provide an output voltage to the rest of the devices.

SUMMARY

Aspects of the disclosure provide a circuit. The circuit includes a depletion mode transistor coupled to a power supply and a current path coupled with the depletion mode transistor in series to provide a current to charge a capacitor. The current path has a first resistance during a first stage, such as when the circuit initially receives power, and has a second resistance during a second stage when the capacitor is charged to have a predetermined voltage level.

In an embodiment, the current path includes a resistive path configured to have the first resistance, and a switchable path coupled in parallel with the resistive path. The switchable path is in an open state during the first stage, and is in a close state during the second stage. In an example, the switchable path includes a transistor and the capacitor voltage powers up a control circuit to turn on the transistor when the capacitor is charged to have the predetermined voltage level.

According to an aspect of the disclosure, the current path includes a diode configured to limit a current direction to charge the capacitor. Further, in an embodiment, the circuit includes a passive voltage clamp component, such as another diode, to restrict a gate voltage of the depletion mode transistor.

According to an embodiment of the disclosure, the depletion mode transistor is an N-type metal-oxide-semiconductor-field-effect-transistor (MOSFET) having a negative threshold voltage, and the capacitor voltage powers up a control circuit to control a gate voltage of the depletion mode transistor.

Aspects of the disclosure provide a method. The method includes charging a capacitor through a depletion mode transistor and a current path having a first resistance during a first stage, such as an initial power receiving stage, and powering up a control circuit with the capacitor voltage and then changing the current path to have a second resistance when the capacitor voltage is at a predetermined voltage level.

Aspects of the disclosure provide an electronic system. The electronic system includes a rectifier configured to receive and rectify a power supply from an AC power source and a circuit configured to receive the rectified power supply. The circuit includes a depletion mode transistor configured to receive the rectified power supply, and a current path coupled with the depletion mode transistor in series to provide a current to charge a capacitor. The current path has a first resistance during a first stage, such as when the circuit initially receives power, and has a second resistance during a second stage when the capacitor is charged to have a predetermined voltage level.

BRIEF DESCRIPTION OF THE DRAWINGS

Various embodiments of this disclosure that are proposed as examples will be described in detail with reference to the following figures, wherein like numerals reference like elements, and wherein:

FIGS. 3A-3C show waveforms according to an embodiment of the disclosure.

DETAILED DESCRIPTION OF EMBODIMENTS

Figure 1:
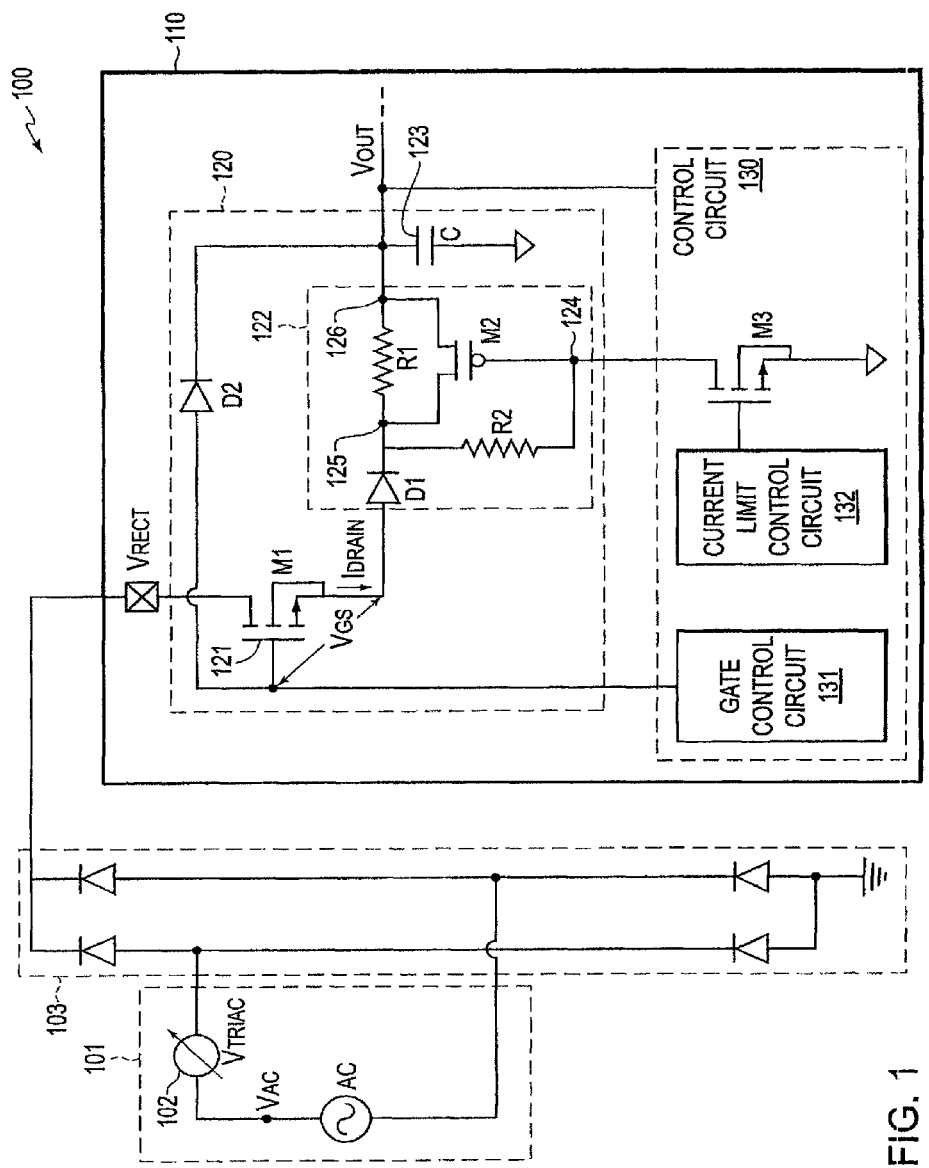
FIG. 1 shows an electronic system 100 according to an embodiment of the disclosure.

FIG. 1 shows an electronic system 100 coupled to an energy source 101 according to an embodiment of the disclosure. The electronic system 100 includes a rectifier 103 and a circuit 110 coupled together as shown in FIG. 1.

The energy source 101 provides electric energy to the electronic system 100. In the FIG. 1 example, the energy source 101 is an alternating current (AC) voltage supply to provide an AC voltage, such as 110V AC supply, 220V AC supply, and the like. In addition, the energy source 101 includes suitable elements to adjust the provided electric energy. For example, the energy source 101 includes a dimmer 102 to suitably adjust the amount of electric energy provided to the electronic system 100.

In an embodiment, the dimmer 102 is a phase angle based dimmer. In an example, the AC voltage supply has a sine wave shape, and the dimmer 102 is a forward-type triode for alternating current (TRIAC) dimmer 102 having an adjustable dimming angle $\alpha$ within $[0, \pi]$. Every time the AC voltage $V_{AC}$ crosses zero, the forward-type TRIAC dimmer 102 stops firing charges for a dimming angle $\alpha$. Thus, in each cycle $[0, 2\pi]$, when the phase of the AC voltage $V_{AC}$ is within $[0, \alpha]$ or $[\pi, \pi+\alpha]$, the TRIAC voltage $V_{TRIAC}$ output from the forward-type TRIAC dimmer 102 is zero; and when the phase of the AC voltage $V_{AC}$ is within $[\alpha, \pi]$ or $[\pi+\alpha, 2\pi]$, the TRIAC voltage $V_{TRIAC}$ follows the AC voltage $V_{AC}$. Generally, $[0, \alpha]$ and $[\pi, \pi+\alpha]$ are referred to as non-conduction angle. Similarly, $[\alpha, \pi]$ and $[\pi+\alpha, 2\pi]$ are referred to as conduction angle.

According to another embodiment of the disclosure, the dimmer 102 is implemented in the electronic system 100. For example, the dimmer 102 in the electronic system 100 receives an AC voltage supply having a sine wave shape. The dimmer 102 in the electronic system 100 then adjusts the amount of electric energy provided to the following components, such as a rectifier, based on a conduction angle.

According to an embodiment of the disclosure, the electronic system 100 is suitably coupled with the energy source 101. In an example, the electronic system 100 includes a power cord that can be manually plugged into a wall outlet (not shown) on a power grid. In another example, the electronic system 100 is coupled to a power grid via a switch (not shown). When the switch is switched on, the electronic system 100 is coupled to the energy source 101, and when the switch is switched off, the electronic system 100 is decoupled from the energy source 101. According to an aspect of the disclosure, the electronic system 100 can be coupled to the energy source 101 at any time during an AC cycle, thus a voltage supply to the electronic system 100 may have a step voltage change. The step voltage change causes an inrush current into the electronic system 100.

The rectifier 103 rectifies the received AC voltage to a fixed polarity, such as to be positive. In the FIG. 1 example, the rectifier 103 is a bridge rectifier 103. The bridge rectifier 103 receives the AC voltage, generates a rectified voltage $V_{RECT}$, and provides the rectified voltage $V_{RECT}$ to other components of the electronic system 100, such as the circuit 110 and the like, to provide electric power to the electronic system 100.

In an embodiment, the circuit 110 is implemented on a single integrated circuit (IC) chip. In another embodiment, the circuit 110 is implemented on multiple IC chips. The electronic system 100 can include other suitable components (not shown), such as a transformer, a light bulb, a plurality of light emitting diodes (LEDs), a fan, another circuit, and the like, that are suitably coupled with the circuit 110. In an example, the circuit 110 provides control signals to control the operations of the other components. In another example, the circuit 110 receives feedback signals from the other components indicative of the operations of the other components, and provides the control signals to control the operations of the other components based on the feedback signals.

According to an embodiment of the disclosure, the circuit 110 includes a start-up circuit 120, and a control circuit 130. The start-up circuit 120 is configured to receive power supply, setup and maintain a voltage $V_{OUT}$, and provide the voltage $V_{OUT}$ to other circuits, such as the control circuit 130, to enable the operations of the other circuits. The control circuit 130 is configured to generate control signals to control, for example, the start-up circuit 120 after the start-up to maintain the voltage $V_{OUT}$.

Specifically, in an embodiment, the circuit 110 has an initial power receiving stage and a normal operation stage. In an example, when a power cord of the electronic system 100 is plugged in the wall outlet, the start-up circuit 120 starts to receive power supply, and the circuit 110 enters the initial power receiving stage. In another example, when a switch is switched on that couples the electronic system 100 with the energy source 101, the start-up circuit 120 starts to receive power supply, and the circuit 110 enters the initial power receiving stage.

During the initial power receiving stage, the start-up circuit 120 starts to receive power supply and sets up the voltage $V_{OUT}$. In an example, the start-up circuit 120 includes a capacitor 123, and the voltage $V_{OUT}$ is the voltage on the capacitor 123. During the initial power receiving stage, the start-up circuit 120 charges up the capacitor 123. According to an embodiment of the disclosure, the control circuit 130 requires a supply voltage to be larger than a threshold. Thus, in an example, before the voltage $V_{OUT}$ on the capacitor 123 is charged up to a certain level, the control circuit 130 is unable to provide suitable control signals to the start-up circuit 120, and the start-up circuit 120 is in a self-control operation mode that the start-up circuit 120 operates without control from other circuits.

When the voltage $V_{OUT}$ on the capacitor 123 is charged up to the certain level, the voltage $V_{OUT}$ is large enough to enable the operations of the control circuit 130, and the circuit 110 enters the normal operation stage. During the normal operation stage, the control circuit 130 provides suitable control signals to the start-up circuit 120 to control the start-up circuit 120 to suitably charge the capacitor 123 to maintain the voltage $V_{OUT}$ on the capacitor 123.

In the FIG. 1 example, the start-up circuit 120 includes a depletion mode transistor 121 (M1) coupled in series with a current path 122 to charge the capacitor 123. The current path 122 has different resistivity in the initial power receiving stage and in the normal operation stage. In an example, the current path 122 has a relatively large resistivity in the initial power receiving stage to limit a current passing the depletion mode transistor 121, and has a relatively low resistivity in the normal operation stage to support running at a relatively higher load.

The depletion mode transistor 121 is configured to be conductive when control voltages are not available, such as during the initial power receiving stage, and the like. In the FIG. 1 example, the depletion mode transistor 121 is an N-type depletion mode metal-oxide-semiconductor-field-effect-transistor (MOSFET) that has a negative threshold voltage, such as negative three-volt and the like. It is noted that the circuit 110 can be suitably modified to use a P-type depletion mode MOSFET as the depletion mode transistor 121. Before the circuit 100 enters the initial power receiving stage or at the time when the circuit 100 enters the initial power receiving stage, the gate-to-source and the gate-to-drain voltages of the N-type depletion mode MOSFET 121 are about zero and are larger than the negative threshold voltage, thus an N-type conductive channel exists between the source and drain of the N-type depletion mode MOSFET 121. The N-type depletion mode MOSFET 121 allows an inrush current to enter the circuit 100 and charge the capacitor 123 at the time when the circuit 100 enters the initial power receiving stage.

According to an embodiment of the disclosure, the gate voltage of the depletion mode transistor 121 is suitably controlled during the initial power receiving stage and during the normal operation stage. In the FIG. 1 example, during the initial power receiving stage, the gate voltage of the depletion mode transistor 121 is clamped with regard to the capacitor voltage $V_{OUT}$, and during the normal operation stage, the gate voltage of the depletion mode transistor 121 is controlled by a gate control circuit 131 in the control circuit 130.

In the FIG. 1 example, the current path 122 includes a diode D1, a first resistor R1, a second resistor R2, and a transistor M2. These elements are coupled together as shown in FIG. 1. The diode D1 is configured to limit a current direction to charge the capacitor 123, and avoid discharging the capacitor 123 when the instantaneous voltage of the rectified voltage $V_{RECT}$ is lower than the capacitor voltage $V_{OUT}$, for example.

In the FIG. 1 example, the first resistor R1 forms a resistive path, and the transistor M2 forms a switchable path in parallel with the resistive path. When the circuit 100 is in the initial power receiving stage, the switchable path is an open path, and thus the resistive path (e.g., the first resistor R1) dominates the resistivity of current path 122; and when the circuit 100 is in the normal operation stage, the switchable path is a short path and dominates the resistivity of the current path 122. In an example, the transistor M2 is an enhance mode transistor, such as an enhance mode P-type MOSFET, configured to have a suitable threshold voltage. The gate voltage of the enhance mode P-type MOSFET transistor M2 is collectively controlled by the second resistor R2, and a portion of the control circuit 130, such as a current limit control circuit 132 and a transistor M3.

During the initial power receiving stage, the current limit control circuit 132 is unable to provide suitable control signal to the transistor M3, and the transistor M3 is off and does not conduct current, for example. Thus, there is substantially no current passing through the second resistor R2, and the gate voltage of M2 (voltage at node 124) is about the same as the source voltage (voltage at node 125). The diode D1 limits the current direction in the first resistor R1, the drain voltage of M2 (voltage at node 126) is lower or about the same as the source voltage (voltage at node 125). Because the gate-source voltage and gate-drain voltage of the enhance mode P-type MOSFET M2 do not satisfy a threshold voltage requirement, thus the enhance mode P-type MOSFET M2 is turned off.

During the normal operation stage, the current limit control circuit 132 generates a gate control signal to turn on/off the transistor M3 to control the current path 122. In an example, when the transistor M3 is turned on to pass a current, the current also passes the second resistor R2, and causes a voltage drop from node 125 to node 124. In an example, the gate control signal to the transistor M3 is suitable configured such that the voltage drop is enough to turn on the transistor M2 to provide a much lower resistance path than the first resistor R1. Thus, less current flows through the first resistor R1, and the power consumption by the first resistor R1 is reduced.

Further, according to an embodiment of the disclosure, the start-up circuit 120 includes a second diode D2 that couples the gate of the depletion mode N-type MOSFET transistor M1 to node 126 that has the voltage $V_{OUT}$. The second diode D2 clamps the gate voltage of the depletion mode transistor M1 not to substantially exceed the voltage $V_{OUT}$.

Further, the second diode D2, the first diode D1, and the first resistor R1 collectively stable the gate-source voltage ($V_{GS}$) of the depletion mode transistor M1, and the drain current $I_{DRAIN}$ of the depletion mode transistor M1 during the initial power receiving stage. Specifically, during the initial power receiving stage, in an example, when the forward voltage drop of the first diode D1 and of the second diode D2 are about the same, the gate-source voltage $V_{GS}$ of the depletion mode transistor M1 is substantially equal to the negative of the voltage drop on the first resistor R1. The configuration of the second diode D2, the first diode D1, the first resistor R1 and the depletion mode transistor M1 form a feedback loop to stable the drain current $I_{DRAIN}$.

In an example, when the gate-source voltage $V_{GS}$ increases, the drain current $I_{DRAIN}$ also increases. The increased drain current $I_{DRAIN}$ increases the voltage drop on the first resistor R1, and decreases the gate-source voltage. Similarly, when the gate-source voltage $V_{GS}$ decreases, the drain current $I_{DRAIN}$ also decreases. The decreased drain current $I_{DRAIN}$ also decreases the voltage drop on the first resistor R1, and then increases the gate-source voltage. In an example, the resistance of the first resistor R1 is suitably selected to obtain a desired drain current $I_{DRAIN}$.

During operation, in an example, when a power cord of the electronic system 100 is plugged in the wall outlet or when a switch is switched on that couples the electronic system 100 with the energy source 101, the start-up circuit 120 starts to receive power supply, and the circuit 110 enters the initial power receiving stage. During the initial power receiving stage, the electric current enters the start-up circuit 120 to charge the capacitor 123. Because the output voltage $V_{OUT}$ is lower than a certain level, the control circuit 130 is unable to provide suitable control signals to the start-up circuit 120. Thus, the transistor M2 is turned off, the first resistor R1 dominates the resistivity of the current path 122 and limits the inrush current. Further, the gate voltage of the depletion mode transistor M1 is clamped by the second diode D2 to stable the drain current $I_{DRAIN}$. Thus, during the initial power receiving stage, the start-up circuit 120 limits the inrush current for charging the capacitor 123, and protects the depletion mode transistor M1 from high power dissipation induced failure.

When the output voltage $V_{OUT}$ is enough to enable the control circuit 130 to provide control signals, the circuit 110 enters the normal operation stage. During the normal operation stage, the current limit control circuit 132 provides suitable control signal to turn on the transistor M3, and thus turn on the transistor M2 to reduce current flowing through the first resistor R1. In addition, the gate control circuit 131 provides suitable control signals to control the gate voltage of the depletion mode transistor M1 in order to control the charging current to the capacitor 123, and maintain the output voltage $V_{OUT}$ in a certain range in an example.

It is noted that the circuit 110 can be suitably modified. In the FIG. 1 example, the control circuit 130 is coupled to the capacitor 123 to be powered up. In another example, the control circuit 130 is coupled to the node 125 to be powered up.

Figure 2:
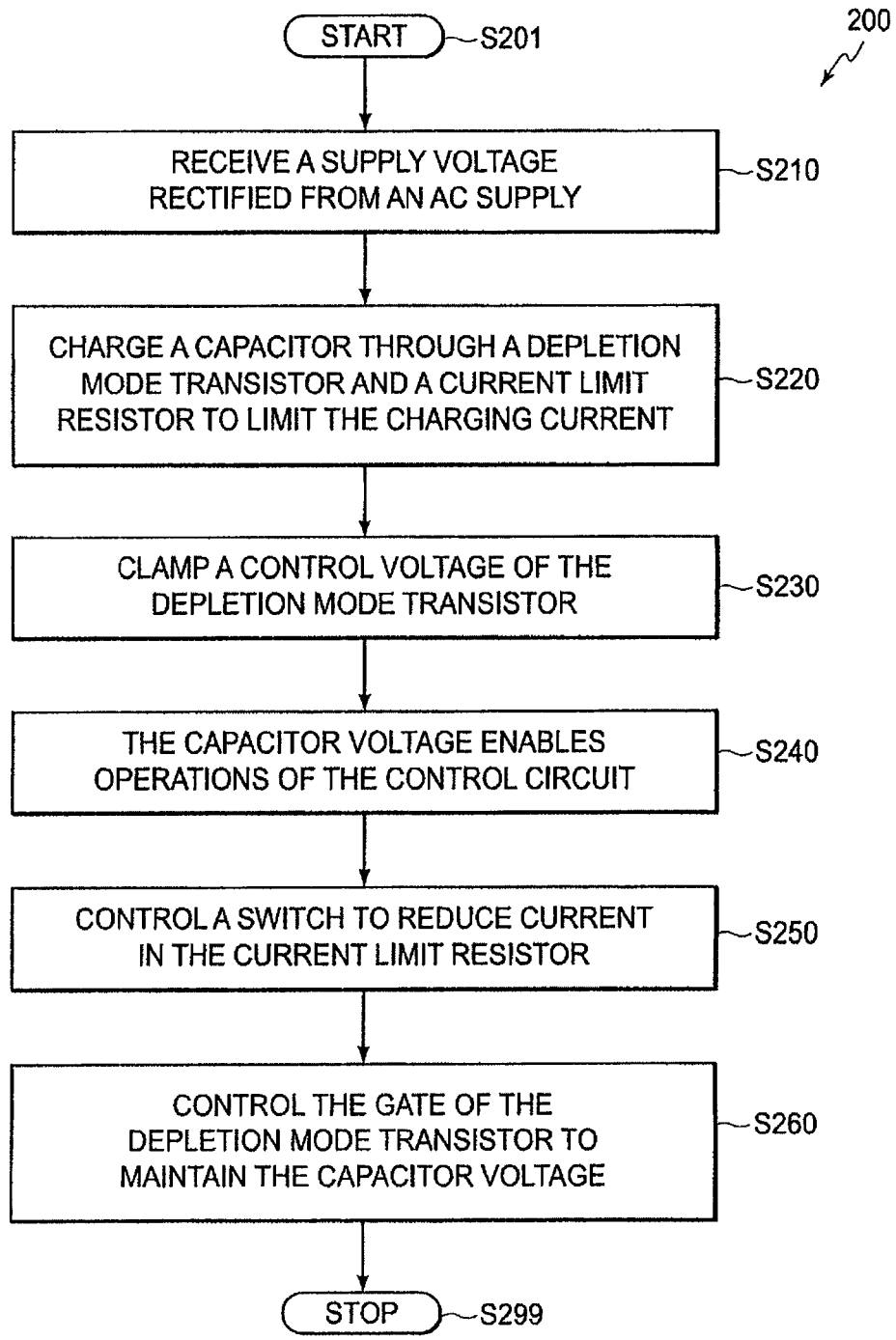
FIG. 2 shows a flowchart outlining a process 200 according to an embodiment of the disclosure.

FIG. 2 shows a flowchart outlining a process 200 to start up the circuit 100 according to an embodiment of the disclosure. The process starts at S201, and proceeds to S210.

At S210, the circuit 100 receives a supply voltage rectified from an AC power supply and the circuit 100 enters the initial power receiving stage. In an example, when a power cord of the electronic system 100 is plugged in the wall outlet or when a switch is switched on that couples the electronic system 100 with the energy source 101, the voltage $V_{RECT}$ becomes non-zero, and provides power to the circuit 100. The start-up circuit 120 starts operation.

At S220, the start-up circuit 120 charges the capacitor 123 through the depletion mode MOSFET transistor 121, and the first resistor R1 that limits the charging current during the initial power receiving stage. The capacitor voltage $V_{OUT}$ is provided to other circuits, such as the control circuit 130, and the like, of the circuit 100. Because the output voltage $V_{OUT}$ is lower than a certain level, the control circuit 130 is unable to provide suitable control signals to the start-up circuit 120 during the initial power receiving stage. Thus, the transistor M2 is turned off, the first resistor R1 dominates the resistivity of the current path 122 and limits the inrush current.

At S230, the gate voltage of the depletion mode transistor M1 is clamped by the second diode D2 to avoid being too high during the initial power receiving stage, and the gate-source voltage $V_{GS}$ of the depletion mode transistor M1 is stabled to limit and stable the drain current $I_{DRAIN}$. The start-up circuit 120 limits and stables the inrush current for charging the capacitor 123, and protects the depletion mode transistor 121 from high power dissipation induced failure.

At S240, when the output voltage $V_{OUT}$, which is the capacitor voltage, is high enough, the output voltage $V_{OUT}$ enables operations of other circuit of the circuit 110, such as the control circuit 130. Then, the control circuit 130 provides control signals to the start-up circuit 120, and the circuit 110 enters the normal operation stage.

At S250, during the normal operation stage, the current limit control circuit 132 provides a suitable control signal to turn on the transistor M3, and thus turn on the transistor M2 to reduce current flowing through the first resistor R1.

At S260, during the normal operation stage, the gate control circuit 131 provides a suitable control signal to control the gate voltage of the depletion mode transistor M1 and thus control the drain current $I_{DRAIN}$ to charge the capacitor 123, and maintain the output voltage $V_{OUT}$ in a certain range in an example. Then, the process proceeds to S299 and terminates.

Figure 3A:
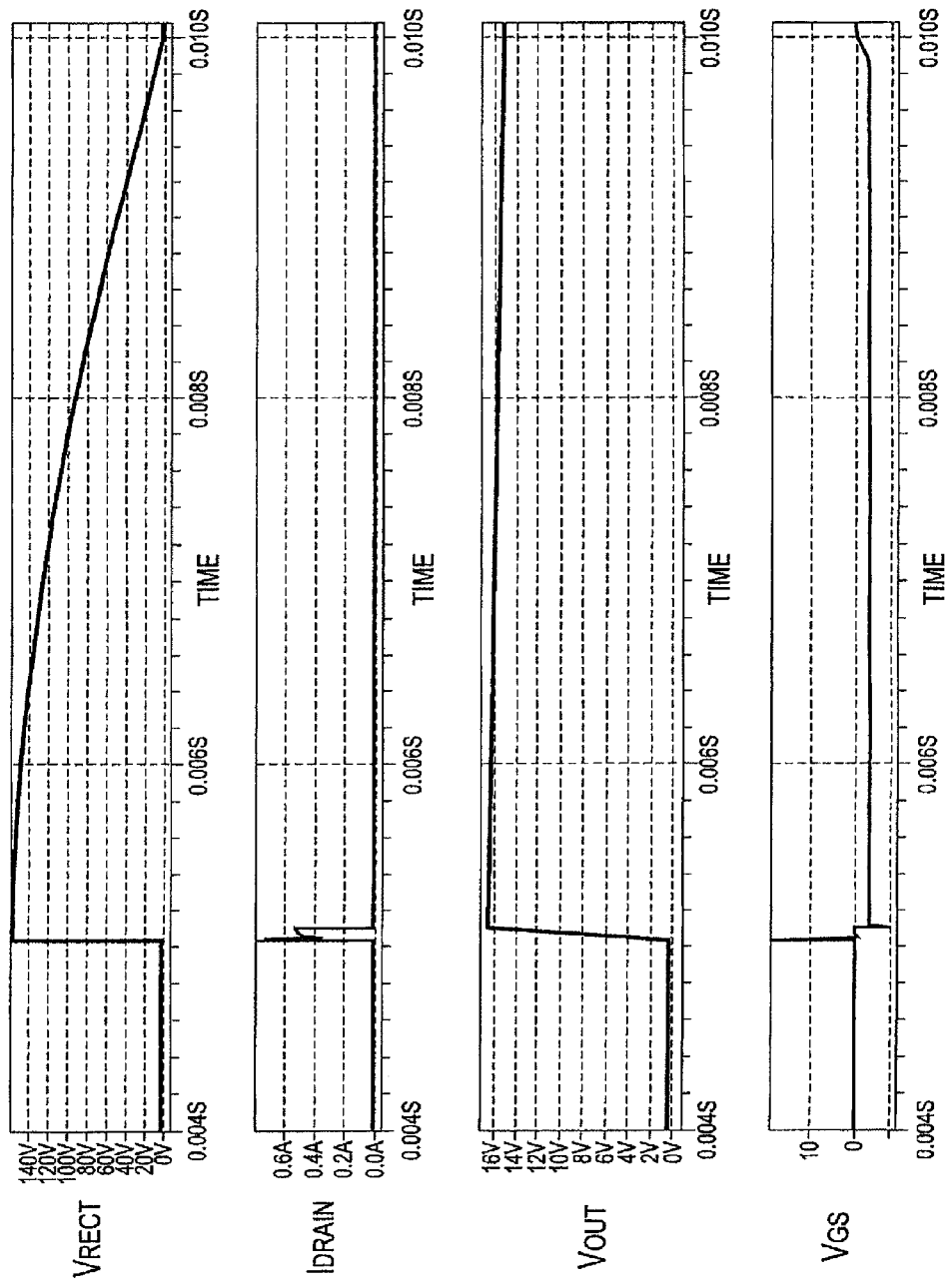
Figure 3B:
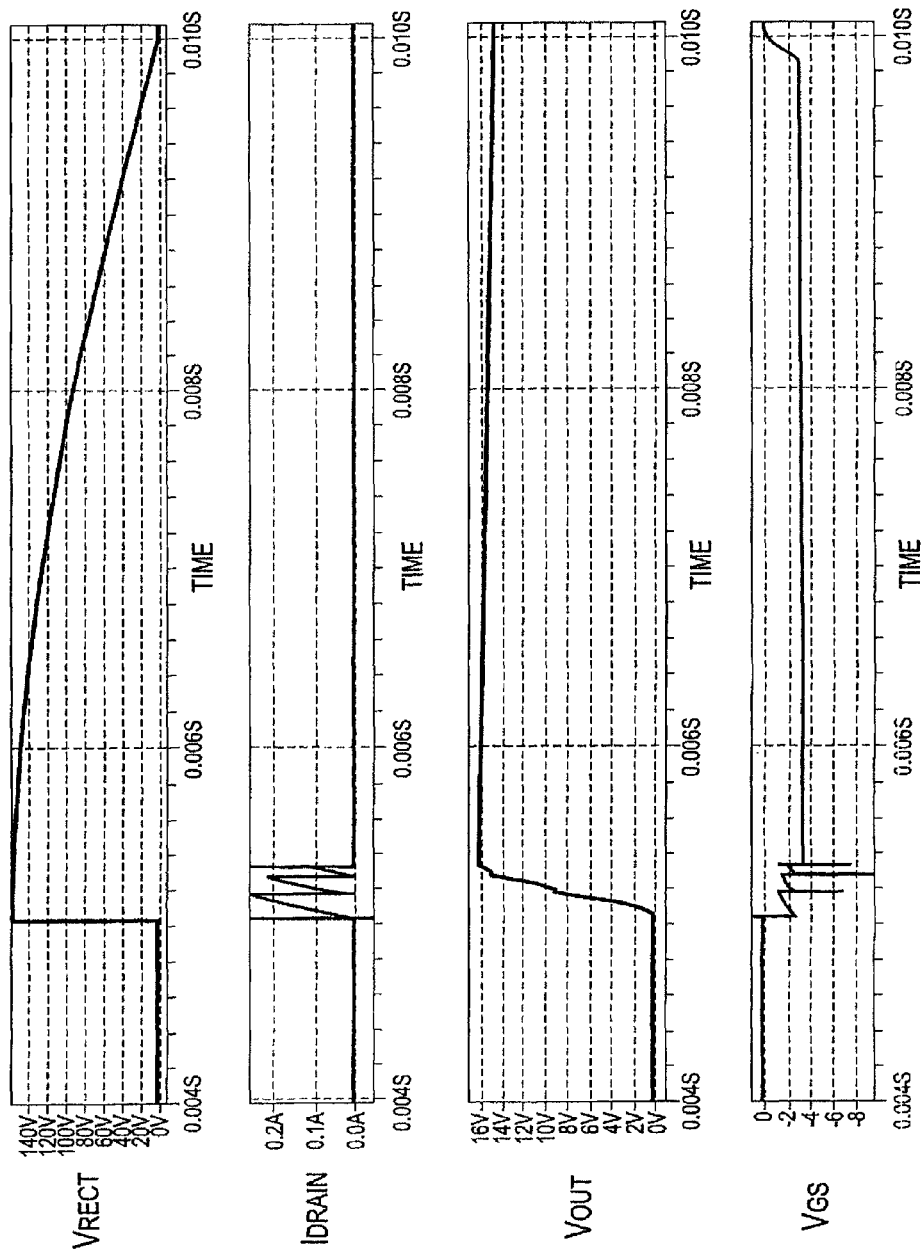

FIGS. 3A-3C show waveforms according to an embodiment of the disclosure.

FIG. 3A shows waveforms when the second diode D2, the first resistor R1, and second resistor R2 and the transistor M2 are not in the start-up circuit 120, and the depletion mode transistor M1 charges the capacitor 123 via the first diode D1.

In FIG. 3A, at about time 0.005 seconds, a switch is switched on and couples the electronic system 100 with the energy source 101, the rectified voltage $V_{RECT}$ has a significant change, such as a voltage step change from zero to 150V in FIG. 3A. The voltage change causes a large inrush current $I_{DRAIN}$, such as more than 0.6 A, passing the depletion mode transistor 121 to charge the capacitor 123. The capacitor voltage $V_{OUT}$ increases to about 15V in very short time, such as in less than 0.0001 seconds. In addition, the gate-source voltage of the depletion mode transistor 121 may temperately become very high, such as over 20V. The high gate-source voltage and large inrush current can cause relatively large power dissipation at the depletion mode transistor 121, and damage the depletion mode transistor 121.

FIG. 3B shows waveforms when the second diode D2 is not in the start-up circuit 120, and the depletion mode transistor M1 charges the capacitor 123 via the current path 122.

In FIG. 3B, at about time 0.005 seconds, a switch is switched on and couples the electronic system 100 with the energy source 101, the rectified voltage $V_{RECT}$ has a significant change, such as a voltage step change from zero to 150V in FIG. 3B. Because of the first resistor R1, a relatively small drain current $I_{DRAIN}$, such as about 0.25 A, passes through the depletion mode transistor 121 to charge the capacitor 123. Because the gate voltage of the depletion mode transistor 121 is not suitably controlled in this example, the gate-source voltage $V_{GS}$ of the depletion mode transistor 121 is not stable. The variation of the gate-source voltage $V_{GS}$ causes significant drain current $I_{DRAIN}$ variation. The capacitor voltage $V_{OUT}$ increases to about 15V in about 0.0003 seconds.

FIG. 3C shows waveforms when the second diode D2 is used in the start-up circuit 120 to clamp the gate voltage of the depletion mode transistor 121, and the depletion mode transistor M1 charges the capacitor 123 via the current path 122.

In FIG. 3C, at about time 0.005 second, a switch is switched on and couples the electronic system 100 with the energy source 101, the rectified voltage $V_{RECT}$ has a significant change, such as a voltage step change from zero to 150V in FIG. 3C. Because of the first resistor R1 that limits the inrush current and because of the second diode D2 that clamps the gate voltage of the depletion mode transistor 121, the gate-source voltage of the depletion mode transistor 121 is relatively stable, and the drain current $I_{DRAIN}$ is relatively small and relatively stable, such as about 0.013 A. The capacitor voltage $V_{OUT}$ increases to about 15V in a relatively long time, such as in about 0.003 seconds.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
    circuitry creating a current path beginning at a drain of a first transistor to provide a current to charge a capacitor, the current path having a first resistance during a first stage, and having a second resistance during a second stage when the capacitor is charged to have a predetermined voltage level, wherein the current path further comprises:
    a resistor configured to have the first resistance; and
    a switchable path coupled in parallel with the resistor.
2. The circuit of claim 1, wherein
    the switchable path is in an open state during the first stage, and is in a close state during the second stage when the capacitor is charged to have the predetermined voltage level.
3. The circuit of claim 2, wherein
    the switchable path includes a second transistor, and
    the circuit further includes circuitry configured to power up to turn on the second transistor when the capacitor is charged to have the predetermined voltage level.
4. The circuit of claim 1, wherein the first resistance is larger than the second resistance.
5. The circuit of claim 1, wherein the current path further comprises:
    circuitry configured to limit a current direction to charge the capacitor.
6. The circuit of claim 1, further comprising:
    circuitry configured to restrict a gate voltage of the first transistor.
7. The circuit of claim 6, further comprising:
    circuitry configured to clamp the gate voltage of the first transistor with regard to the capacitor voltage.
8. The circuit of claim 1, wherein the capacitor voltage powers up circuitry configured to control a gate voltage of the first transistor.
9. The circuit of claim 1, wherein the first transistor is an N-type metal-oxide-semiconductor-field-effect-transistor (MOSFET) having a negative threshold voltage.
10. The circuit of claim 1, wherein the circuit is in the first stage when the circuit initially receives power.
11. A method, comprising:
    charging a capacitor through a first transistor and a current path, beginning at a drain of the first transistor, having a first resistance, the current path including a resistor configured to have the first resistance and a switchable path coupled in parallel with the resistor; and
    powering up circuitry with a capacitor voltage and then changing the current path to have a second resistance when the capacitor voltage is at a predetermined voltage level.
12. The method of claim 11, wherein powering up the circuitry with the capacitor voltage and then changing the current path to have the second resistance when the capacitor voltage is at the predetermined voltage level further comprises:
    powering up the circuitry with the capacitor voltage to switch a path from an open state to a close state when the capacitor voltage is at the predetermined voltage level.
13. The method of claim 12, wherein powering up the circuitry with the capacitor voltage to switch the path from the open state to the close state when the capacitor voltage is at the predetermined level further comprises:
    powering up the circuitry to turn on a second transistor in the path when the capacitor voltage is at the predetermined voltage level.
14. The method of claim 11, wherein powering up the circuitry with the capacitor voltage and then changing the current path to have the second resistance further comprises:
    powering up the circuitry to reduce a resistance of the current path from the first resistance to the second resistance.
15. The method of claim 11, further comprising:
    limiting a current direction to charge the capacitor.
16. The method of claim 11, further comprising:
    clamping a gate voltage of the first transistor.
17. The method of claim 16, wherein clamping the gate voltage of the first transistor further comprises:
    clamping the gate voltage of the first transistor with regard to the capacitor voltage.

18. The method of claim 11, further comprising:
powering up the circuitry to control a gate voltage of the first transistor which is a mode metal-oxide-semiconductor-field-effect-transistor (MOSFET).

19. The method of claim 11, wherein charging the capacitor through the first transistor and the current path having the first resistance further comprises:
charging the capacitor through the first transistor and the current path having the first resistance during an initial power receiving stage.

20. An electronic system, comprising:
a rectifier configured to receive and rectify a power supply from an AC power source; and
circuitry creating a current path beginning at a drain of a first transistor to provide a current to charge a capacitor, the current path having a first resistance during a first stage, and having a second resistance during a second stage when the capacitor is charged to have a predetermined capacitor voltage, wherein the current path further comprises:
a resistor configured to have the first resistance; and
a switchable path coupled in parallel with the resistor.

21. The electronic system of claim 20, wherein
the switchable path includes a second transistor, and
the circuitry further includes control circuitry configured to be powered up to turn on the second transistor and control a gate voltage of the first transistor when the capacitor is charged to have the predetermined capacitor voltage.

22. The electronic system of claim 21, wherein the circuitry is further configured to:
limit a current direction to charge the capacitor; and
clamp a gate voltage of the first transistor with regard to the capacitor voltage.

23. The electronic system of claim 21, wherein the control circuitry is coupled to the capacitor directly or is coupled to the capacitor indirectly to be powered up.

* * * * *